United States Patent
Kim et al.

(10) Patent No.: US 9,869,807 B2
(45) Date of Patent: Jan. 16, 2018

(54) ELECTRONIC DEVICES WITH SOFT INPUT-OUTPUT COMPONENTS

(71) Applicant: Apple Inc., Cupertino, CA (US)

(72) Inventors: Hoon Sik Kim, San Jose, CA (US);
Yung-Yu Hsu, San Jose, CA (US);
Paul S. Drzaic, Morgan Hill, CA (US)

(73) Assignee: Apple Inc., Cupertino, CA (US)

( * ) Notice: Subject to any disclaimer, the term of this patent is extended or adjusted under 35 U.S.C. 154(b) by 49 days.

(21) Appl. No.: 15/070,498

(22) Filed: Mar. 15, 2016

(65) Prior Publication Data
US 2017/0003440 A1    Jan. 5, 2017

Related U.S. Application Data

(60) Provisional application No. 62/186,785, filed on Jun. 30, 2015.

(51) Int. Cl.
*F21V 9/00* (2015.01)
*F21V 8/00* (2006.01)
*G06F 1/16* (2006.01)
*H01L 51/00* (2006.01)

(52) U.S. Cl.
CPC ......... *G02B 6/0041* (2013.01); *G02B 6/0065* (2013.01); *G02B 6/0068* (2013.01); *G02B 6/0073* (2013.01); *G06F 1/1652* (2013.01); *G06F 2203/04102* (2013.01); *G06F 2203/04106* (2013.01); *G06F 2203/04109* (2013.01); *H01L 51/0097* (2013.01)

(58) Field of Classification Search
CPC ....... H05B 33/22; H05B 33/145; H05B 33/10
USPC ................. 362/231, 249.02, 249.08, 249.09
See application file for complete search history.

(56) References Cited

U.S. PATENT DOCUMENTS

| | | | |
|---|---|---|---|
| 7,168,840 B2 * | 1/2007 | Leu | G02B 6/0025 313/508 |
| 7,712,910 B2 | 5/2010 | Ng et al. | |
| 8,332,053 B1 | 12/2012 | Patterson et al. | |
| 8,865,489 B2 | 10/2014 | Rogers et al. | |
| 2002/0094701 A1 | 7/2002 | Biegelsen et al. | |
| 2006/0258205 A1 | 11/2006 | Locher et al. | |

(Continued)

FOREIGN PATENT DOCUMENTS

| | | |
|---|---|---|
| KR | 10-1453419 | 10/2014 |
| KR | 10-1551823 | 9/2015 |
| WO | 2014200428 | 12/2014 |

*Primary Examiner* — Vip Patel
(74) *Attorney, Agent, or Firm* — Treyz Law Group, P.C.; G. Victor Treyz; David K. Cole

(57) ABSTRACT

An electronic device may have control circuitry coupled to input-output devices such as a display. A flexible input-output device may be formed from an elastomeric substrate layer. The substrate layer may have signal paths to which components are mounted. Openings may be formed in the elastomeric substrate layer between the signal paths to create a stretchable mesh-shaped substrate. The electrical components may each include an interposer having solder pads soldered to the elastomeric substrate. Electrical devices such as micro-light-emitting diodes may be soldered to the interposers. The electrical components may also include electrical devices such as sensors and actuators. A stretchable lighting unit may have a stretchable light guide illuminated by a stretchable light source.

15 Claims, 22 Drawing Sheets

(56) References Cited

U.S. PATENT DOCUMENTS

| | | | |
|---|---|---|---|
| 2007/0133935 A1* | 6/2007 | Fine | B82Y 5/00 |
| | | | 385/131 |
| 2010/0330338 A1 | 12/2010 | Boyce et al. | |
| 2012/0065937 A1 | 3/2012 | de Graff et al. | |
| 2012/0165759 A1 | 6/2012 | Rogers | |
| 2013/0188324 A1 | 7/2013 | Lee et al. | |
| 2013/0201720 A1* | 8/2013 | Sherman | G02B 6/0068 |
| | | | 362/607 |
| 2014/0056028 A1 | 2/2014 | Nichol | |
| 2014/0340857 A1 | 11/2014 | Hsu et al. | |
| 2015/0280129 A1 | 10/2015 | Kim et al. | |

* cited by examiner

ELECTRONIC DEVICES WITH SOFT INPUT-OUTPUT COMPONENTS

This application claims the benefit of provisional patent application No. 62/186,785, filed Jun. 30, 2015, which is hereby incorporated by reference herein in its entirety.

BACKGROUND

This relates generally to electronic devices, and, more particular, to input-output components for electronic devices.

Electronic devices such as cellular telephones, computers, and other electronic devices contain integrated circuits and other electrical components. Input-output devices such as displays and touch sensors can be used in an electronic device to provide output to a user and to gather input from a user.

It can be challenging to incorporate input-output devices into an electronic device. Form factor considerations, reliability considerations, and various other factors may make it difficult or impossible for conventional input-output components to be used in certain devices. As an example, if an electronic device has bendable portions, traditional displays and touch sensors mounted in the device may be subject to stress-induced failures.

It would therefore be desirable to be able to provide electronic devices with improved input-output devices.

SUMMARY

An electronic device may have control circuitry coupled to input-output devices. A flexible input-output device such as a display or a display with integrated sensors and haptic output may be formed from an elastomeric substrate layer. The substrate layer may have signal paths to which an array of electrical components may be mounted. Openings or thinned areas may be formed in the elastomeric substrate layer between the signal paths. An array of through-hole openings may be formed in the substrate to create a mesh-shaped substrate that can be stretched in one or more dimensions. The signal paths that extend between the openings to interconnect the electrical components may have serpentine shapes that help to accommodate stretching.

The electrical components may each include an interposer having solder pads soldered to the elastomeric substrate. Electrical devices such as micro-light-emitting diodes may be soldered to the interposers. The electrical components may also include electrical devices such as sensors and actuators. An array of components on the mesh-shaped substrate may include light-emitting components such as components containing micro-light-emitting diodes and/or laser diodes, sensor components such as touch sensors, force sensors, temperature sensors, accelerometers, and other sensors, and vibrators or other devices for providing haptic feedback. An input-output device may have transparent components such as a transparent substrate to allow light to pass through the input-output device.

A display or other component in an electronic device may have stretchable lighting structures. A stretchable lighting unit may, for example, have a stretchable light guide formed from a sheet of elastomeric material and a stretchable light source. The stretchable light source may be formed from light-emitting diodes that are coupled to each other using stretchable signal paths such as signal paths formed from serpentine signal lines.

DETAILED DESCRIPTION

Figure 1:
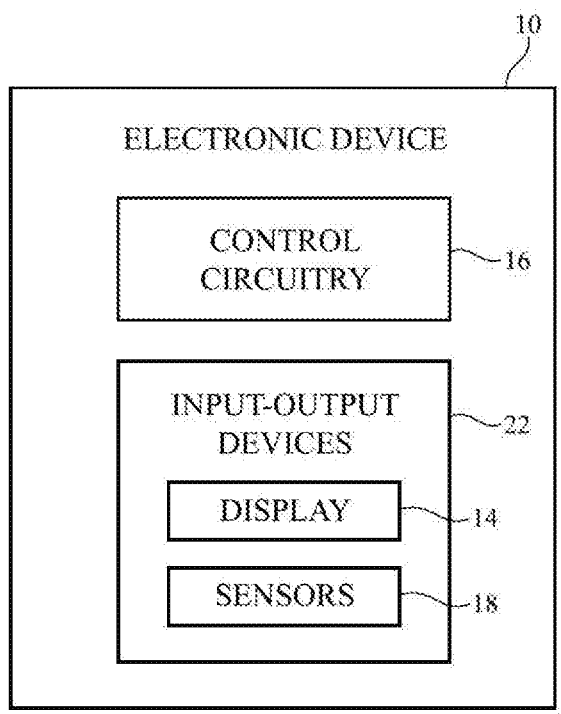
FIG. 1 is a schematic diagram of an illustrative electronic device having input-output devices in accordance with an embodiment.

An illustrative electronic device of the type that may be provided with flexible input-output devices is shown in FIG. 1. As shown in FIG. 1, electronic device 10 may have control circuitry 16. Control circuitry 16 may include storage and processing circuitry for supporting the operation of device 10. The storage and processing circuitry may include storage such as hard disk drive storage, nonvolatile memory (e.g., flash memory or other electrically-programmable-read-only memory configured to form a solid state drive), volatile memory (e.g., static or dynamic random-access-memory), etc. Processing circuitry in control circuitry 16 may be used to control the operation of device 10. The processing circuitry may be based on one or more microprocessors, microcontrollers, digital signal processors, baseband processors, power management units, audio chips, application specific integrated circuits, etc.

Input-output circuitry in device 10 such as input-output devices 22 may be used to allow data to be supplied to device 10 and to allow data to be provided from device 10 to external devices. Input-output devices 22 may include buttons, joysticks, scrolling wheels, touch pads, key pads, keyboards, microphones, speakers, tone generators, vibrators (e.g., piezoelectric vibrating components, etc.), cameras, sensors, light-emitting diodes and other status indicators, data ports, etc. A user can control the operation of device 10 by supplying commands through input-output devices 22 and may receive status information and other output from device 10 using the output resources of input-output devices 22.

Input-output devices 22 may include one or more displays such as display 14. Display 14 may be a touch screen display that includes a touch sensor for gathering touch input from a user or display 14 may be insensitive to touch. A touch sensor for display 14 may be based on an array of capacitive touch sensor electrodes, acoustic touch sensor structures, resistive touch components, force-based touch sensor structures, a light-based touch sensor, or other suitable touch sensor arrangements. If desired, display 14 may include actuators to provide haptic feedback for a user.

Sensors 18 in input-output devices 22 may include strain gauge sensors, proximity sensors, ambient light sensors, touch sensors, force sensors, temperature sensors, pressure sensors, magnetic sensors, accelerometers, gyroscopes and other sensors for measuring orientation (e.g., position sensors, orientation sensors), microelectromechanical systems sensors, and other sensors. Sensors 18 may be light-based sensors (e.g., proximity sensors or other sensors that emit and/or detect light), capacitive sensors (e.g., sensors that measure force and/or touch events using capacitance measurements). Strain gauges, piezoelectric elements, capacitive sensors, and other sensors may be used in measuring applied force and can therefore be used to gather input from a user's fingers or other external source of pressure. Capacitive touch sensors may make capacitance measurements to detect the position of a user's finger(s). If desired, sensors 18 may include microphones to gather audio signals. Sensors 18 may be incorporated into display 14. For example, display 14 may have an array of light-emitting diodes and sensors 18 and/or actuator components may be incorporated into the array to provide display 14 with the ability to sense user input and provide haptic feedback in addition to the ability to display images for the user.

Control circuitry 16 may be used to run software on device 10 such as operating system code and applications. During operation of device 10, the software running on control circuitry 16 may be used in gathering user input and making environmental measurements using sensors 18 and may be used in providing output to a user with display 14 and other output resources in input-output devices 22.

Device 10 may form all or part of a tablet computer, laptop computer, a desktop computer, a monitor that includes an embedded computer, a monitor that does not include an embedded computer, a display for use with a computer or other equipment that is external to the display, a cellular telephone, a media player, a wristwatch device or other wearable electronic equipment, equipment that is integrated into furniture, equipment that is integrated into a vehicle, equipment that is built into windows or architectural elements in a building, a kiosk, seating, clothing, a strap for a bag or watch, a lanyard or other structure for supporting a pendant device, a cover or other enclosure for a portable device (e.g., a bag, a computer case, a phone case, a tablet computer cover, etc.), or other suitable device.

Display 14 may include light-emitting pixels based on organic light-emitting diodes, discrete crystalline light-emitting diode dies (sometimes referred to as micro-light-emitting diodes or micro-LEDs), or other suitable pixel elements. Sensors 18 may include discrete sensors and sensors that are formed from arrays of elements (e.g., arrays of strain sensors, arrays of light-based sensors, etc.).

If desired, input-output devices 22 may include flexible devices (sometimes referred to as soft or bendable devices) that have the ability to be bent or otherwise deformed into a variety of non-planar shapes. These devices may be displays such as display 14, sensor panels, and/or displays that incorporate sensors 18 and/or actuators.

Figure 2:
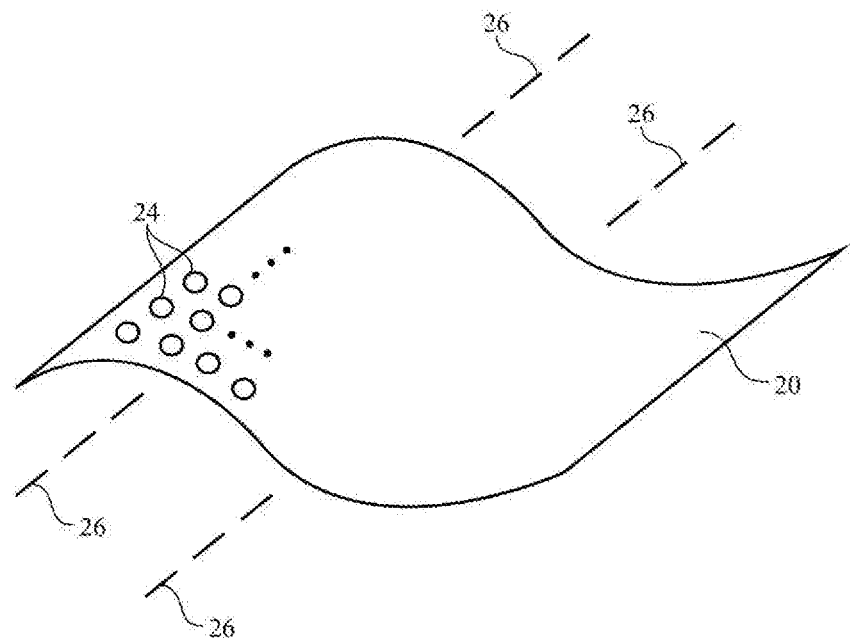
FIG. 2 is a perspective view of an illustrative flexible input-output device having an array of components in accordance with an embodiment.
Figure 3:
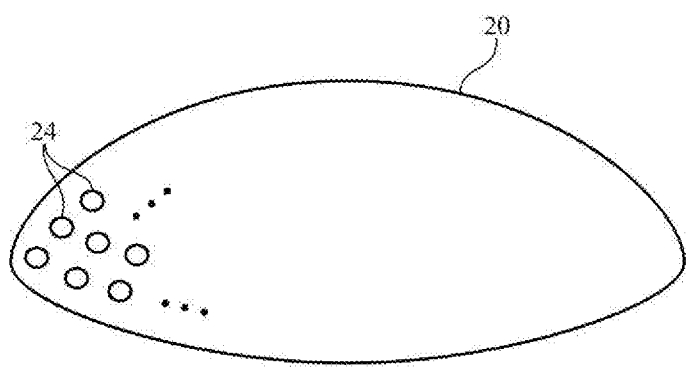
FIG. 3 is a perspective view of an illustrative flexible input-output device that has been deformed into a dome shape in accordance with an embodiment.

Illustrative flexible input-output devices are shown in FIGS. 2 and 3. As shown in FIG. 2, flexible input-output device 20 may be flexed (bent) about various bend axes 26 to form a wavy planar shape. FIG. 3 shows how flexible input-output device 20 may be sufficiently flexible to deform in multiple dimensions. Deformations of the type shown in FIGS. 2 and 3 may allow input-output devices 20 to conform to a human body part such as the wrist or chest of a user.

As shown in FIGS. 2 and 3, a flexible input-output device may contain an array of one or more different types of electrical components 24. Components 24 may include light-emitting diodes (e.g., micro-light-emitting diodes), organic light-emitting diodes, vibrators or other electrically controlled actuators, sensors 18, sound-producing components, and/or other electrical devices.

Figure 4:
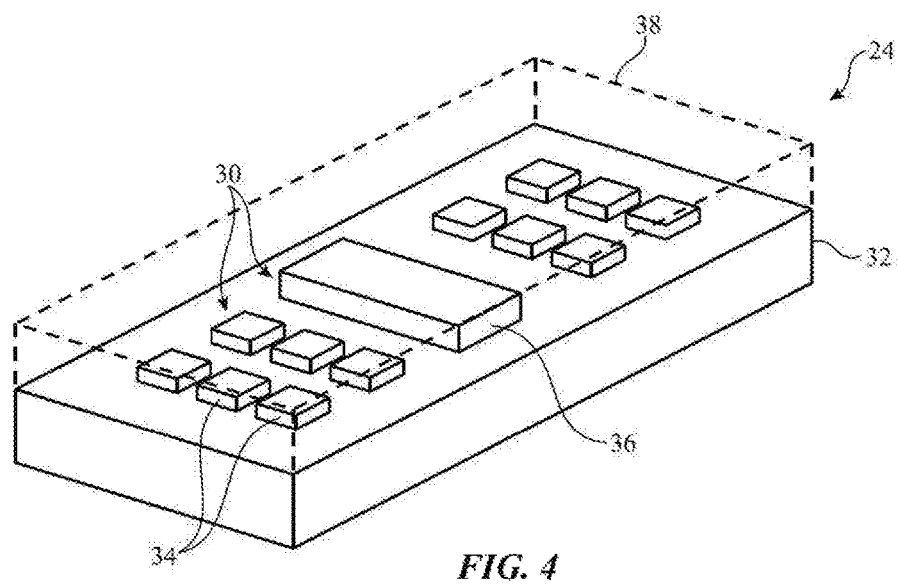
FIG. 4 is a front perspective view of an illustrative component that has been formed by mounting electrical devices on an interposer in accordance with an embodiment.

Components 24 may include circuitry mounted in plastic packages, ceramic packages, packages with solder pads and other contacts to couple components 24 to metal traces on flexible printed circuit substrates and other electrical paths, and/or other packaging. With one illustrative configuration, which is shown in FIG. 4, a component such as component 24 may include multiple electrical devices 30 mounted on a substrate such as substrate 32. Substrate 32 may be formed from molded plastic, rigid printed circuit board material (e.g., a fiberglass-filled epoxy material such as FR4 or other printed circuit board dielectric), flexible printed circuit board material (e.g., a sheet of polyimide or a flexible layer of other polymer), a ceramic substrate, and/or other substrate material. Substrate 32 may include one or more layers of metal traces separated by layers of dielectric. The layers of metal traces may form signal interconnect paths. These paths may couple components such as electrical devices 30 to each other and to contact pads on substrate 32. Electrical devices 30 may, if desired, be encapsulated in a polymer (e.g., a clear polymer) or other encapsulant such as encapsulating layer 38.

Figure 5:
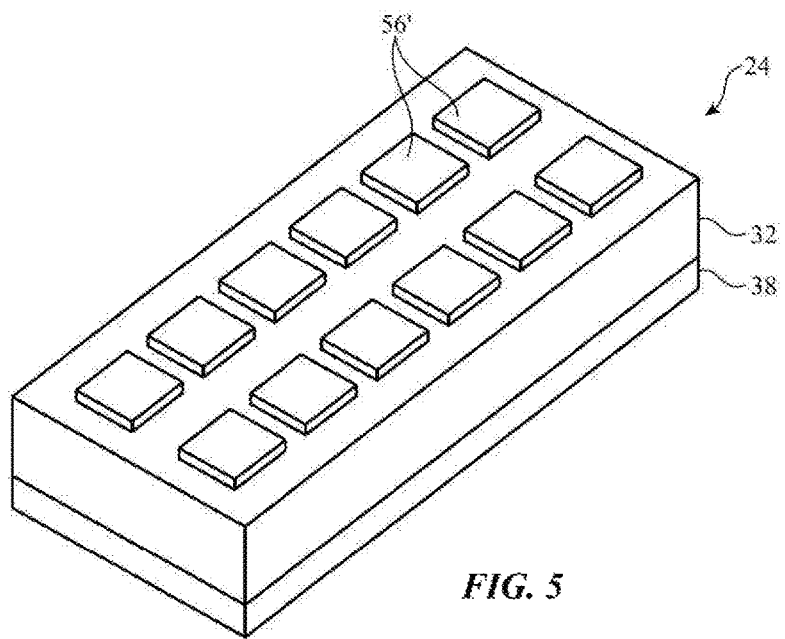
FIG. 5 is a rear view of the component of FIG. 4 in accordance with an embodiment.

Electrical devices 30 may include, for example, components 34 and one or more integrated circuits such as integrated circuit 36. Integrated circuits 36 may be coupled to components 34 using the interconnects in each substrate 32. Integrated circuits 36 may also be coupled to signal paths in input-output device 20 using interposer contacts such as contacts 56' (shown in the rear perspective view of component 24 in FIG. 5). There may be any suitable number of contacts 56' for each component 24 (e.g., 2-10, 4-20, 2-8, fewer than 10, more than 10, fewer than 20, more than 5, etc.). Integrated circuits 36 may use these signal paths to receive information from control circuitry 16 that is to be output to a user using components 24 (e.g., image data to display using an array of light-emitting components 24). Integrated circuits 36 may also use these signal paths to provide sensor data or other input that has been captured using components 24 to control circuitry 16 (e.g., user touch sensor and force sensor input that has been gathered with sensors in components 24).

Components 34 may be electrical devices such as light-emitting diodes (e.g., micro-light-emitting diodes), sensors 18, vibrators, other actuators, and/or other circuitry. If desired, components 24 may include both output devices (e.g., light-emitting diodes, actuators, etc.) and input components (force sensors, touch sensors, temperature sensors, accelerometers, etc.). Components 34 (and/or circuits 36) may be radio-frequency communications circuits (e.g., radio-frequency transceiver circuits, radio-frequency identification (RFID) chips, or other integrated circuits capable of handling wireless communications). Configurations in which each component 24 contains either a set of one or more output devices (e.g., light-emitting diodes) or a set of one or more input devices (e.g., a sensor) may sometimes be described herein as an example. With one suitable arrangement, components 24 each include a set of multiple micro-light-emitting diodes (e.g., red, green, and blue light-emitting diodes). Redundant light-emitting diodes may be included in component 24 and may be switched into use in response to detection of a faulty light-emitting diode during testing. There may be one, two, three, or more than three redundant sets of light-emitting diodes on each interposer substrate 32.

If desired, components 24 that contain faulty circuitry can be replaced during manufacturing rework operations. For example, a pick and place tool (e.g., a tool based on an elastomeric or electromagnetic pick heads), a tool with a laser, hot bar, infrared heating element, or other heating device to heat solder joints, thermocompression bonding equipment, or other equipment may remove a faulty component by melting solder connections between the faulty component and the signal paths in input-output device 20. Once the faulty component has been removed, the pick and place tool or other equipment may be used to solder a replacement component onto the signal paths in place of the removed faulty component.

To accommodate deformation (e.g., bending and/or stretching in one or more dimensions), input-output device 20 may be formed by mounting an array of components 24 to a flexible substrate. The flexible substrate may have signal paths that accommodate deformation of the substrate without cracking.

Figure 6:
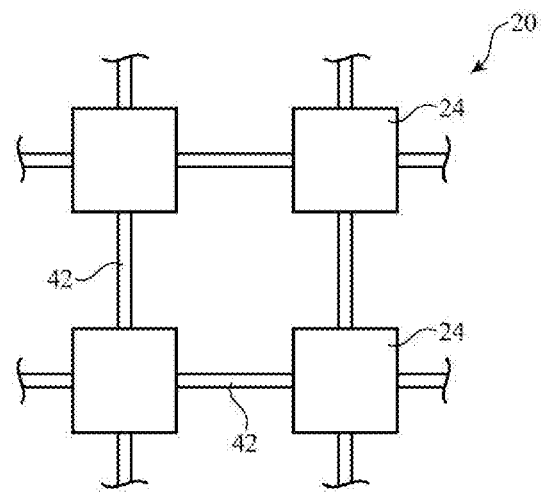
FIG. 6 is a top view of an array of components that have been joined using straight signal path segments in accordance with an embodiment.
Figure 7:
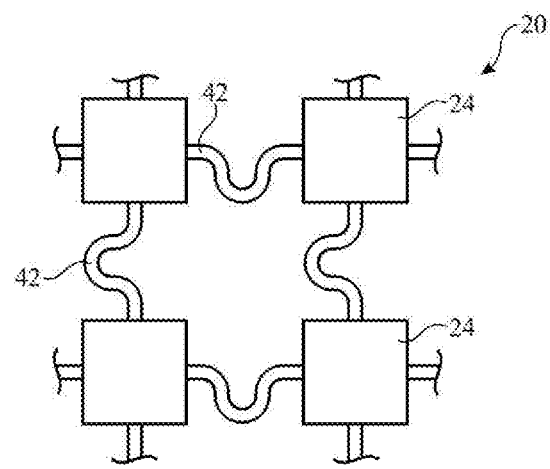
FIG. 7 is a top view of an array of components that have been joined using serpentine signal paths that extend past thinned or opened areas in a substrate in accordance with an embodiment.

FIGS. 6 and 7 are illustrative top views of device 20 showing how device 20 may contain an array of components 24 interconnected by corresponding signal paths 42. Paths 42 may have segments that extend between respective pairs of components 24. The overall shape of paths 42 may form a mesh (i.e., a grid). The signal paths may be straight (see, e.g., paths 42 of FIG. 6), may be serpentine to help accommodate stretching (see, e.g., paths 42 of FIG. 7), may have vertical undulations (in and out of the page of FIG. 7), or may have other suitable shapes.

The arrays of components 24 that are used in forming device 20 may have rows and columns. Components 24 may also be organized in other patterns (e.g., hexagonal patterns, arrays with triangular elements, Penrose tiling, pseudorandom patterns, etc.). In the examples of FIGS. 6 and 7, input-output device 20 has rectangular arrays of components 24 and paths 42 run horizontally and vertically. Other configurations may be used, if desired.

Signal paths 42 may include one or more signal lines. For example, each signal path 42 may contain 2-10 signal lines, may contain fewer than 10 signal lines, may contain 5-20 signal lines, or may contain more than 4 signal lines. Dielectric (e.g., organic thin films such as insulating polymers, inorganic films such as silicon oxide, silicon nitride, metal oxides, etc.) may be used to electrically isolate the signal lines in paths 42 from each other.

The conductive lines that make up signal paths 42 may be formed from conductive materials such metal (e.g., aluminum, copper, etc.), transparent conductive material (e.g., indium tin oxide), carbon nanotubes or other nanotubes, silver nanowires, carbon nanowires, or other nanowires, graphene and derivatives of graphene, or other conductive trace materials. These conductive traces may be formed from stretchable material such as conductive ink (e.g., conductive particles such as silver particles, copper particles, nickel particles, or other metal particles, nanotubes, or nanowires that are supported using a polymer matrix such as a stretchable polymer matrix).

During deformation of the substrate of input-output device 20, serpentine paths such as paths 42 of FIG. 7 may serve as springs that can deform to accommodate stretching without cracking the conductive material that forms the serpentine paths. Accordingly, serpentine paths or other undulating paths (paths that meander back and forth within the plane of the array of components 24 and/or that meander back and forth out of the plane of the array of components 24 in device 20) may tend to accommodate more deformation than straight line paths.

To provide serpentine paths and other paths such as straight paths with enhanced stretchability, it may be desirable to from straight and serpentine paths 42 from stretchable conductive materials and stretchable dielectrics. As an example, the dielectric that is used in isolating the conductive lines in paths 42 from each other may be formed from a stretchable polymer such as silicone, polyurethane, acrylic, or other elastomeric (low modulus) polymer that can stretch without failing. If desired, the stretchable dielectric may be a composite material (e.g., a polymer filled with inorganic particles or other particles) or a hybrid material (e.g., a material including combinations of polymer and fiber). Stretchable conductive materials for forming the signal lines of paths 42 may include stretchable conductive inks (e.g., conductive particles in a stretchable polymer matrix). In situations in which the serpentine shape or other stretch-accommodating shape of paths 42 can accommodate stretching without significantly stretching the material that makes up the signal lines in paths 42, the dielectric and conductive line materials of paths 42 may be formed from materials that exhibit reduced stretchability (e.g., metals, inorganic dielectrics, etc.).

To enhance the flexibility of input-output device 20, it may be desirable to mount components 24 on a substrate with thinned portions or openings. For example, before or after soldering or otherwise mounting components 24 to a flexible polymer substrate layer, portions of the polymer substrate layer may be removed using die cutting, laser cutting, etching, or other processing techniques. This will provide the substrate layer with a mesh (grid) shape that can accommodate deformation. The removed portions of the polymer substrate layer may be rectangular, circular, or oval, may have other shapes with straight and/or curved edges, may all be the same shape, may have a variety of different shapes, may all have the same size, may have multiple different sizes, may have a mixture of shapes and/or sizes that create an irregular mesh, may have portions that pass entirely through the substrate (i.e., to form through-hole openings) and/or that thin the substrate without passing entirely through the substrate, or may have other suitable configurations to enhance flexibility of input-output device 20.

Figure 8:
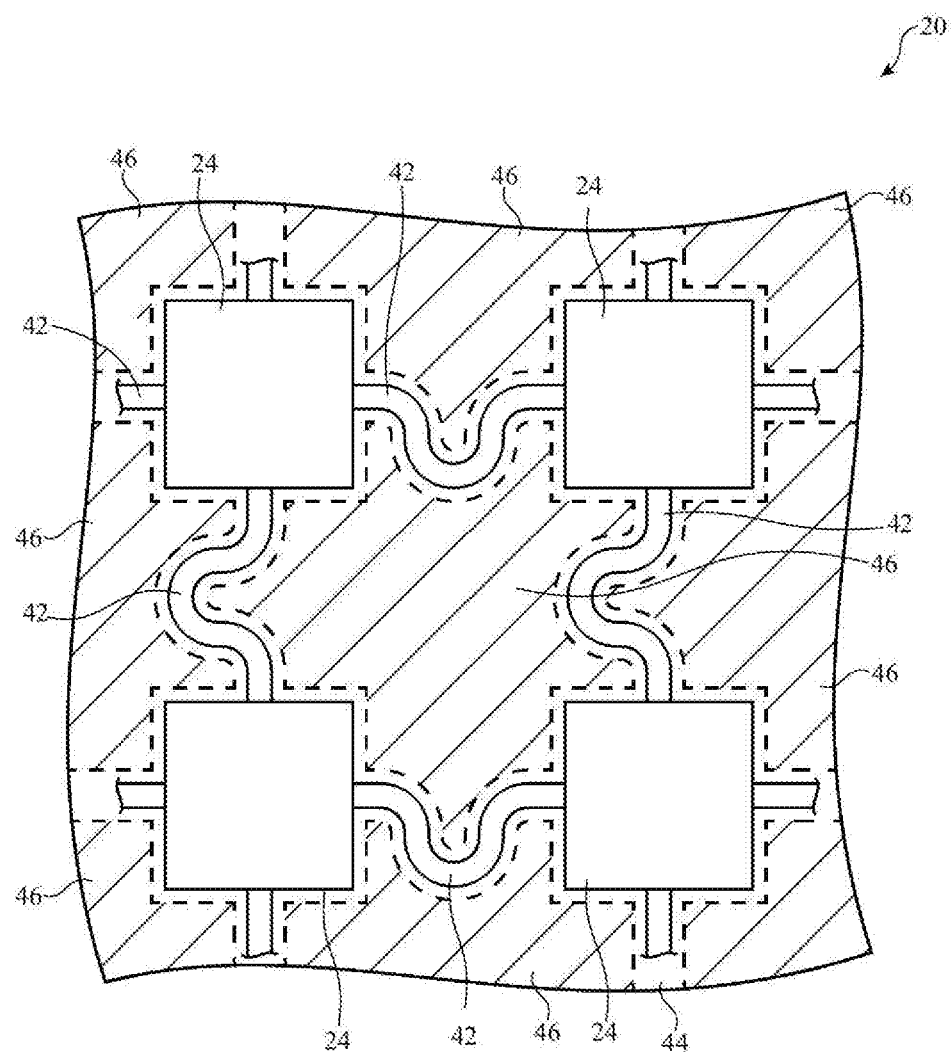
FIG. 8 is a top view of an illustrative array of components on a substrate with serpentine path segments for joining adjacent components in accordance with an embodiment.

The portions of the substrate for input-output device 20 that have not been thinned or removed to form openings for the mesh (i.e., the portions of the mesh that remain attached to components 24) may be used in forming signal paths 42. This type of arrangement is shown in FIG. 8. FIG. 8 is a top view of a portion of input-output device 20 showing how components 24 (e.g. electrical devices mounted on interposers) may be mounted to substrate such as substrate 44. Segments of substrate 44 extend between respective components 24 and contain signal lines formed from metal traces and/or conductive inks, transparent conductors, nanowires, nanotubes, graphene, and/or other conductive materials. These signal lines may be insulated from each other using the dielectric material of substrate 44 (e.g., silicone, polyurethane, acrylic, or other elastomeric polymer, composite materials, hybrid materials, etc.) and may form signal paths 42 that interconnect components 24 to form the component array of FIG. 8. Signal paths 42 may have serpentine shapes (as shown in the example of FIG. 8) or other suitable shapes.

To promote flexibility of substrate 44, portions 46 of substrate 44 that are not used in forming signal paths 42 may be thinner than the portions of substrate 44 that form paths 42. For example, portions 46 may be thinned or removed completely to form openings in substrate 44. After components 24 have been mounted to substrate 44 and after processing substrate 44 to form a mesh with an array of through-hole openings extending between paths 42 (or after forming a substrate with thinned portions), components 24 and substrate 44 may be mounted on a support structure, may be embedded within or coated by a layer of polymer or other material, or may be laminated between layers of material or otherwise incorporated into structures to complete formation of device 20. Device 20 may then be assembled into electronic device 10.

If desired, mesh-shaped substrates 44 and substrates 44 with locally thinned portions 46 may be formed using an additive process (e.g., by building up signal paths 42 from conductive and/or dielectric layers that are added to substrate 44 in addition to or instead of removing material from substrate 44 in regions 46). Techniques that may be used to remove or thin regions 46 and/or to build up regions 42 include laser ablation (e.g., using a pulsed laser or other suitable laser), photolithography with dry or wet etching, sand blasting, water jet cutting, or other physical removal techniques, die cutting, printing (e.g., ink jet printing, flexographic printing, gravure, stencil printing etc.), blanket deposition of photosensitive polymer layers followed by exposure to light through a mask and subsequent development, shadow mask deposition, etc.

Figure 9:
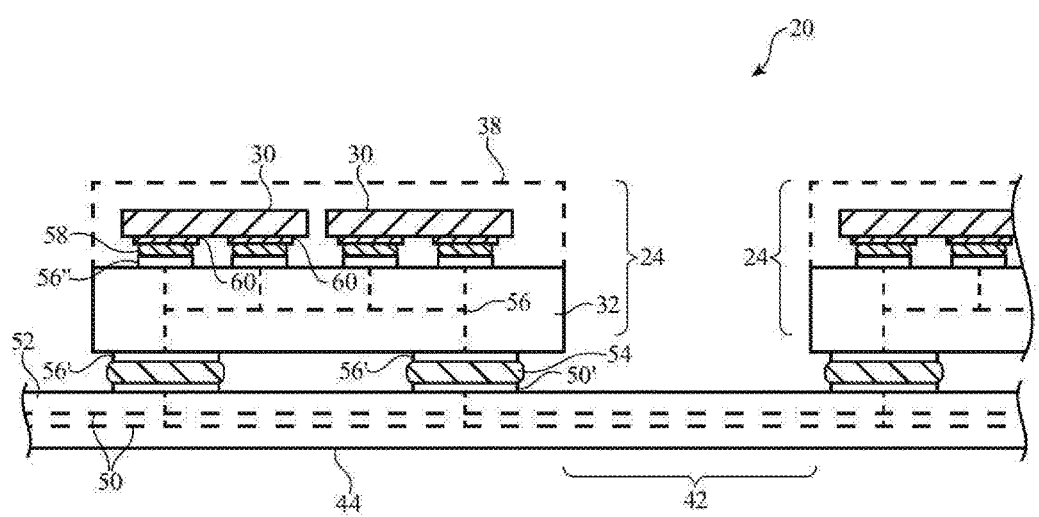
FIG. 9 is a cross-sectional side view of components and a substrate of the type shown in FIG. 8 in accordance with an embodiment.

FIG. 9 is a cross-sectional side view of a portion of input-output device 20 showing how components 20 may be mounted on substrate 44. As shown in FIG. 9, substrate 44 may include one or more layers of patterned metal traces or other conductive lines that form interconnects 50. The metal traces or other conductive structures of substrate 44 may include contacts such as substrate solder pads 50'. Components 24 may have interposer substrates 32. Substrates 32 may include metal traces or other structures for forming interconnects 56. Interconnects 56 may include interposer contacts such as solder pads 56'. Solder 54 (e.g., reflowed solder or solder that forms a joint when subjected to thermocompression bonding techniques or other soldering techniques) may be used to couple pads 56' to pads 50' on substrate 44. Polymer underfill may be placed under interposer 32 to provide solder 54 with environmental protection. Interconnects 56 may include portions that form contacts such as solder pads 56" on the upper surface of interposer substrate 32. Components 30 (e.g., semiconductor devices such as light-emitting diode dies or other electrical devices) may have solder pads 60. Solder 58 may be used to couple pads 60 to pads 56" on substrate 32. Encapsulant 38 may be formed on top of substrate 32 to encapsulate components 30.

It may be desirable to enhance the transparency of input-output device 20. Transparency may be enhanced by forming structures of the type shown in FIG. 9 from transparent materials. As an example, substrates 44 and 32 may be formed from transparent dielectrics (e.g., transparent polymers, glass, transparent ceramic, etc.). Conductive lines for signal paths 42, interconnects 50, and/or interconnects 56 may be formed from indium tin oxide, transparent conductive polymers, or other transparent conductive materials. Transparent material such as transparent conductive adhesive may be used in place of solder 58 and/or solder 54. Encapsulant 38 may be formed from a transparent polymer or other transparent dielectric. When integrating components 24 and substrate 44 with additional structures to form input-output device 20, the additional structures (e.g., plastic layers, fabric layers, etc.) may also be transparent. Transparent structures may be highly transparent (e.g., having a transmission of more than 90% or may be partly transparent (e.g., having a transmission of more than 50% or other lower value).

It may be desirable to provide input-output device 20 with more than one type of component 24. For example, some of components 24 may be light-emitting components such as interposers populated with micro-light-emitting diodes (e.g., red, green, and blue diodes and redundant sets of red, green, and blue diodes), whereas other components 24 may be sensors (e.g., force sensors, touch sensors, temperature sensors, accelerometers, etc.). Yet other components 24 may be vibrators or other actuators for providing tactile feedback or other mechanical output to a user. In this type of arrangement, input-output device 20 may be a display (with pixels formed by light-emitting diodes) having an integrated touch sensor (formed from the force and/or touch sensors) and may have optional tactile feedback (from the actuating components). Other arrangements for combination multiple types of components 24 into device 20 may be used, if desired. The use of light-emitting diodes and sensors to form a touch sensing display device with optional force feedback is merely illustrative.

Figure 10:
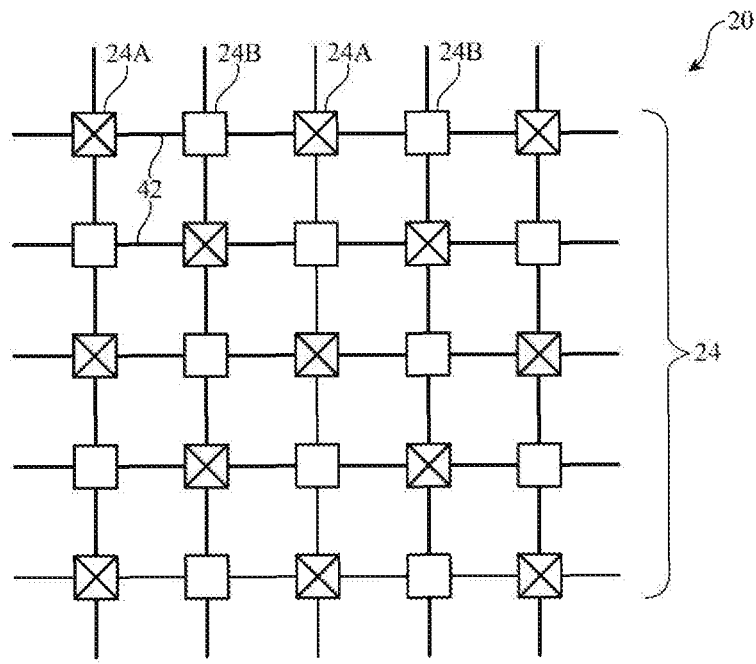
FIG. 10 is a top view of an illustrative array of components having different types of components arranged in a checkerboard pattern in accordance with an embodiment.
Figure 11:
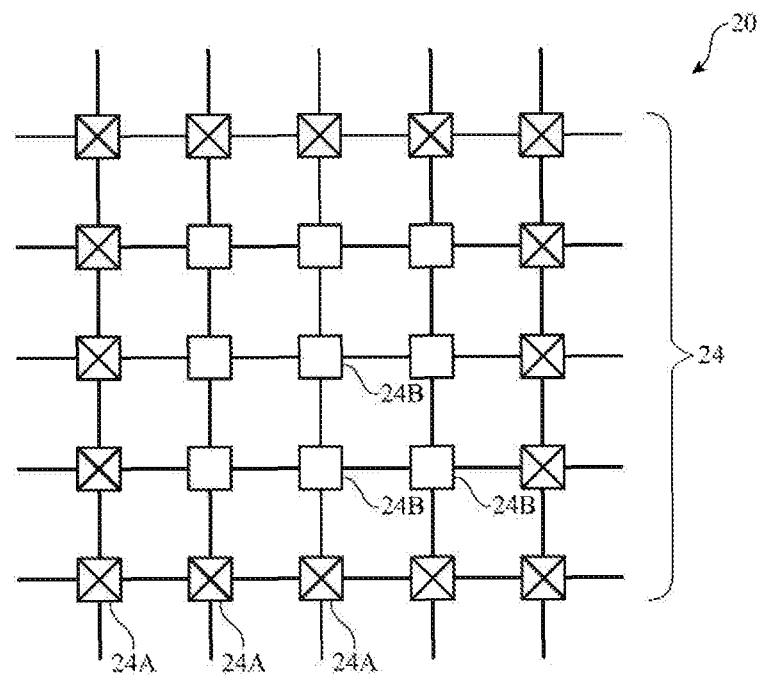
FIG. 11 is a top view of another illustrative array of components having different types of components in accordance with an embodiment.

One way in which to incorporate sensors and light-emitting diodes into the array of components forming device 20 involves incorporating both light-emitting diodes and sensors onto a common interposer (e.g., by mounting multiple different types of components 34 onto interposer 32). Another illustrative technique for incorporating different types of devices into input-output device 20 involves mounting different types of components 24 onto substrate 44. Examples of configurations for device 20 in which the array of components 24 on substrate 44 includes two different types of components (e.g., components 24A and components 24B) are shown in FIGS. 10 and 11.

Components 24A may be micro-light-emitting diodes or other light-emitting diodes (as an example). Components 24B may be sensors and/or mechanical actuators. In the example of FIG. 10, components 24A are interspersed with components 24B in a checkerboard pattern. The array of components in FIG. 11 has a rectangular subarray of components 24B surrounded by components 24A. Other patterns of intermingled components 24 of different types may be used, if desired. The arrangements of FIGS. 10 and 11 are merely illustrative.

Figure 12:
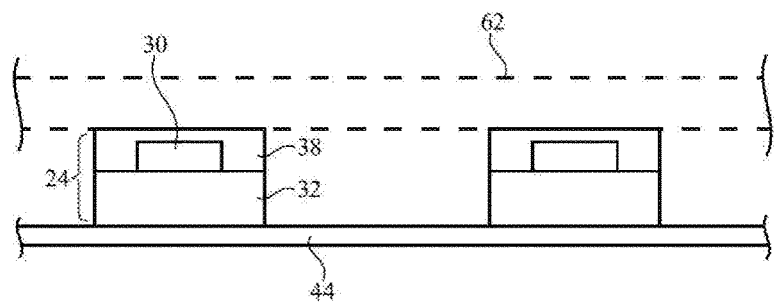
FIG. 12 is a cross-sectional side view of a flexible input-output device being supported by a temporary carrier during manufacturing in accordance with an embodiment.

The mesh formed by thinning or removing portions 46 from substrate 44 and/or by building up paths 42 may make it challenging to handle substrate 44 during manufacturing. FIG. 12 shows how a temporary carrier layer such as a transfer tape or other carrier (carrier 62) may be used to hold components 24 and substrate 44 in place after portions 46 have been thinned and/or removed from substrate 44. Carrier 62 may be used to help peel substrate 44 from a glass carrier or other temporary support structure that is used in forming and patterning substrate 44 and in mounting components 24 to substrate 44 with solder or other conductive material.

After forming the structures of FIG. 12 (e.g., after forming a mesh substrate with attached components 24), the mesh substrate may be combined with other structures to form input-output device 20, as shown by illustrative input-output devices 20 of FIGS. 13, 14, 15, and 16.

Figure 13:
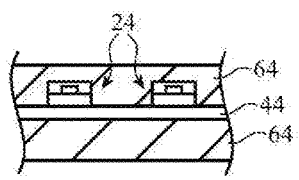
FIG. 13 is a cross-sectional side view of the flexible input-output device of FIG. 12 after embedding the components and substrate of the input-output device in polymer in accordance with an embodiment.

In the example of FIG. 13, input-output device 20 has been formed by encasing substrate 44 and devices 24 in a cast polymer resin, thereby forming a polymer encapsulation layer such as polymer layer 64 in which substrate 44 and components 24 are embedded. Polymer 64 may be transparent silicone, polyurethane, acrylic, composite material, hybrid material, or other transparent elastomeric material to permit light to pass to and/or from components 24.

Figure 14:
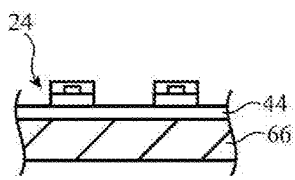
FIG. 14 is a cross-sectional side view of the flexible input-output device of FIG. 12 after mounting the components and substrate of the input-output device to a support structure in accordance with an embodiment.

In the example of FIG. 14, substrate 44 and components 24 have been mounted on support structure 66. Structure 66 may be a layer of plastic, metal, glass, sapphire or other crystalline material, ceramic, fabric, or other material. Adhesive may be used in attaching substrate 44 to layer 66 or substrate 44 may be attached to layer 66 using heat and/or pressure.

Figure 15:
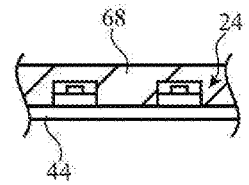
FIG. 15 is a cross-sectional side view of the flexible input-output device of FIG. 12 after coating the components and substrate of the input-output device with an encapsulating layer such as a layer of polymer in accordance with an embodiment.

FIG. 15 shows how an encapsulating layer such as layer 68 may be deposited as a coating over components 24 and the upper surface of substrate 24. Some of layer 68 may penetrate into openings 46. Layer 68 may be formed from a clear polymer such as transparent silicone, polyurethane, acrylic, composite material, hybrid material, or other elastic polymer (as an example). Covering layers such as layer 68 may also be formed from fabric or other suitable materials.

Figure 16:
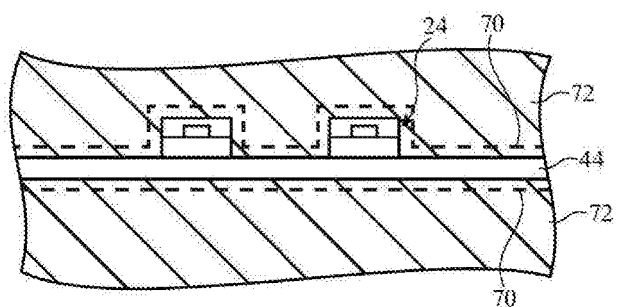
FIG. 16 is a cross-sectional side view of the flexible input-output device of FIG. 12 after laminating the components between layers of material in accordance with an embodiment.

FIG. 16 is a cross-sectional side view of an illustrative configuration for input-output device 20 in scenario in which upper and/or lower layers of material 72 have been laminated to substrate 44 (e.g. to cover components 24 on the upper surface of substrate 44). Adhesive 70 may be interposed between each of layers 72 and substrate 44 to help attach layers 72 to substrate 44. Each of layers 72 may be a layer of plastic, metal, glass, sapphire or other crystalline material, ceramic, fabric, or other material.

If desired, openings such as openings aligned with openings 46 in substrate 44 may be formed in layers 64, 66, 68, and/or one or both of layers 72. Openings may also be formed in layers 64, 66, 68, and/or 72 that are aligned with some or all of components 24. As an example, perforations may be formed in one or more layers of material overlapping components 24 to allow light to be emitted from components 24. Components 24 may be formed on one or both sides of substrate 44.

After forming input-output device 20, input-output device 20 may be integrated with other devices such as driving and sensing systems. Connections may be formed between device 20 and other resources in device 10 using anisotropic conductive film bonding, soldering, welds, crimped connections, connections formed by using these techniques to mount one or more connectors to substrate 44, etc. Signal paths for interconnecting device 20 with other circuitry in device 10 may include ribbon cables, flexible printed circuit cables, coaxial cables and other radio-frequency transmission lines, and other signal paths.

The materials that are added to substrate 44 and components 24 in configurations of the type shown in FIGS. 13, 14, 15, and 16 may provide environmental protection and may help ensure that the neutral stress plane of input-output device 20 is brought into alignment with the signal lines in paths 42 and components 24, thereby reducing stress on components 24 and the interconnects of substrate 44. These added materials may also serve as stress limiter structures that help prevent excess stress from being imposed on device 20 due to bending of device 10.

Input-output device 20 may be used in forming some or all of electronic device 10. Because of the flexibility provided by the openings in substrate 44, the shape of paths 42 (e.g., serpentine shapes that form springs between respective components 24), and the stretchable materials used in forming interconnects 50 in substrate 44 (e.g., interconnects in paths 42), device 20 may be deformed into a wide range of shapes. Flexing of device 20 may take place along one dimension (e.g., device 20 may be bent along a bend axis) or may take place along multiple dimensions (e.g., device 20 may be deformed to follow compound curves in a device housing or support structure or may otherwise be deformed in multiple dimensions). Device 20 may, if desired, be deformed along one or more dimensions without buckling.

Following removal of regions 46, substrate 44 may form a mesh. The mesh may contain traces 50 that run under components 24 (and that are coupled to components 24 via pads 50') and traces 50 that extend along paths 42 between components 24. Components 24 (sometimes referred to as electrical units or islands) may be interconnected using serial and/or parallel signals conveyed over the conductive lines of paths 42.

The use of serpentine structures for paths 42 may allow otherwise rigid thin-film metals and dielectric materials to deform sufficiently in two or three dimensions to accommodate mechanical stresses produced during deformation of input-output device 10. The strain induced in the thin films during deformation may be relatively low. Paths 42 may have accordion shapes, zig zag shapes, figure eight shapes, or other shapes that accommodate deformation.

Components 24 may be individually addressable by sending data and control signals to components 24 over paths 42. By mounting potentially small components such as light-emitting diodes, other semiconductor die, and other components 30 on interposer 32, the size of the pads that are soldered to substrate 44 can be effectively increased from the smaller size associated with pads 60 (e.g., less than 5-10 microns, less than 15 microns, etc.) to the larger size associated with interposer pads 56' (e.g., 50 microns, more than 25 microns, less than 100 microns, etc.)

If desired, each component 24 may be addressable to emit red, green, and/or blue light in response to image data or other pixel data supplied to that component by control circuitry 16. Testing and selective replacement of defective components 24 during manufacturing may enhance yield. Haptic systems and touch sensing systems may be incorporated into input-output device 20 by incorporating sensing and/or actuation components in the components 24 that are mounted on substrate 44. Components 24 may, in general, include components that sense touch, force, temperature, acceleration, that generate haptic feedback, or that have other types of sensing and actuation capabilities. Components 24 such as these may be formed from devices 30 that are mounted on a common interposer substrate 32 with light-emitting diodes or may be formed from devices 30 that are mounted on separate interposer substrates 32 from the substrates used for mounting the light-emitting diodes.

Components 24 may be relatively small. For example, components 30 may have dimensions of about 10 by 10 microns (or other dimensions in the range of 2-100 microns or other suitable size). The outline of integrated circuits such as illustrative integrated circuit 36 of FIG. 4 may be about 150 by 50 microns (or other suitable dimensions in the range of 2-500 microns, above 10 microns, or below 100 microns). Interposers 32 (and therefore components 24) may have dimensions of about 200 by 500 microns, above 100 microns, below 1000 microns, or other suitable size). The potentially small size of components 24 may help ensure that only small amounts of light are blocked by opaque structures in components 24, thereby helping ensure that input-output device 20 is sufficiently transparent for desired applications (e.g., transparent display and/or sensor applications). The small size of components 24 may also allow large densities of components 24 to be formed (e.g., components may be mounted with dot-per-inch values of 100 or more, 10 or more, 300 or more, 50-500, etc.).

Figure 17:
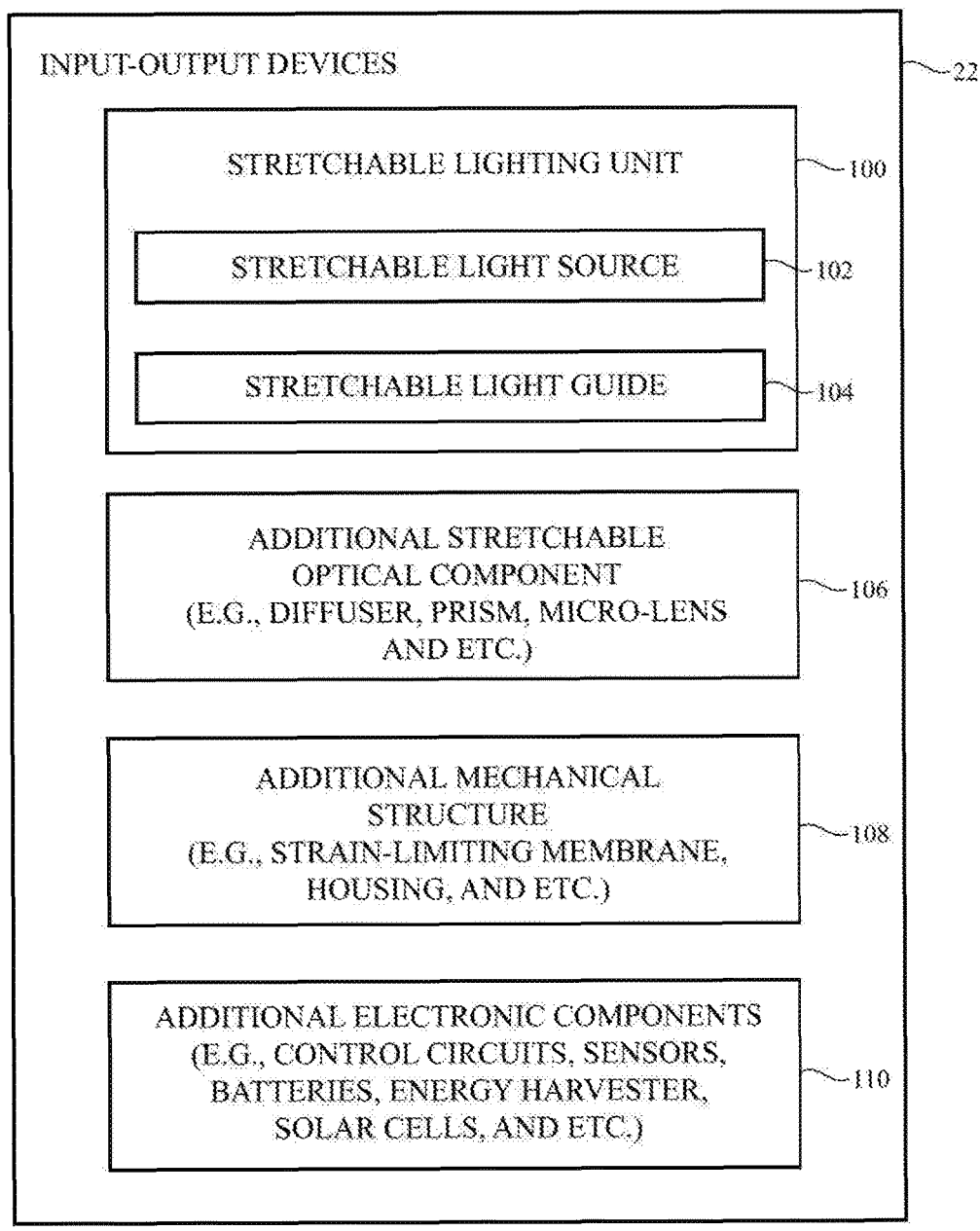
FIG. 17 is a schematic diagram of illustrative input-output devices for an electronic device that include a stretchable lighting unit and other structures in accordance with an embodiment.

If desired, input-output devices 22 may include lighting structures for device 10 such as display backlight units, structures that supply patterned light that serves as decorative trim or that forms characters or symbols (e.g., for a keyboard), light-based sensor structures, lighting for an enclosure, or other lighting structures based on stretchable light guide layers. As shown in FIG. 17, input-output devices 22 may include stretchable lighting structures such as stretchable lighting unit 100.

Stretchable lighting unit 100 may include components (e.g., components 24) that form a stretchable light source such as light source 102 that produces light. The light may be infrared light, ultraviolet light, or visible light. Examples in which the light is visible light may sometimes be described herein as an example. The light from light source 102 may be provided to a stretchable light guide structure such as a stretchable light guide layer 104. Layer 104 may be formed from one or more layers of material (e.g., sheets of transparent elastomeric materials such as stretchable polymer layers, layers with light scattering features, layers that serve as cladding layers, spacer layers, encapsulant layers, and other layers of material). Signal paths 42 (e.g., stretchable serpentine metal lines) may be formed within light source 102 and may be coupled to components 24 to provide signals to components 24.

After light has been launched into stretchable light guide 104, the light may propagate within the interior of light guide 104 (e.g., between upper and lower surfaces of a sheet of clear elastomeric material) due to the principle of total internal reflection. Light scattering features or local deformation due to application of pressure from a user's finger or other external object may cause the light within light guide 104 to be scattered out of light guide 104. The scattered light may be used as backlight for a flexible display (e.g., display layers that form an array of pixels for displaying images for a user), may be used to form a decorative illuminated trim structure, may form part of a finger sensor (e.g., a light-based touch sensor and/or a light-based force sensor, etc.), may form part of a label (e.g., an icon, an alphanumeric character, a logo, etc.), may serve as a source of illumination for a flashlight or ambient lighting structure, may serve as a flash for a camera, or may form other suitable illuminated structure for device 10.

If desired, device 10 and/or input-output devices 22 may include additional structures such as illustrative optical components 106 (e.g., a light diffuser, a prism, lenses, etc.), mechanical structures 108 (e.g., strain-limiting membranes, protective coating layers, housing structures, etc.), and electronic components (e.g., control circuits, sensors, batteries, energy sources based on energy harvesting systems, solar cells, etc.), and other structures.

Figure 18:
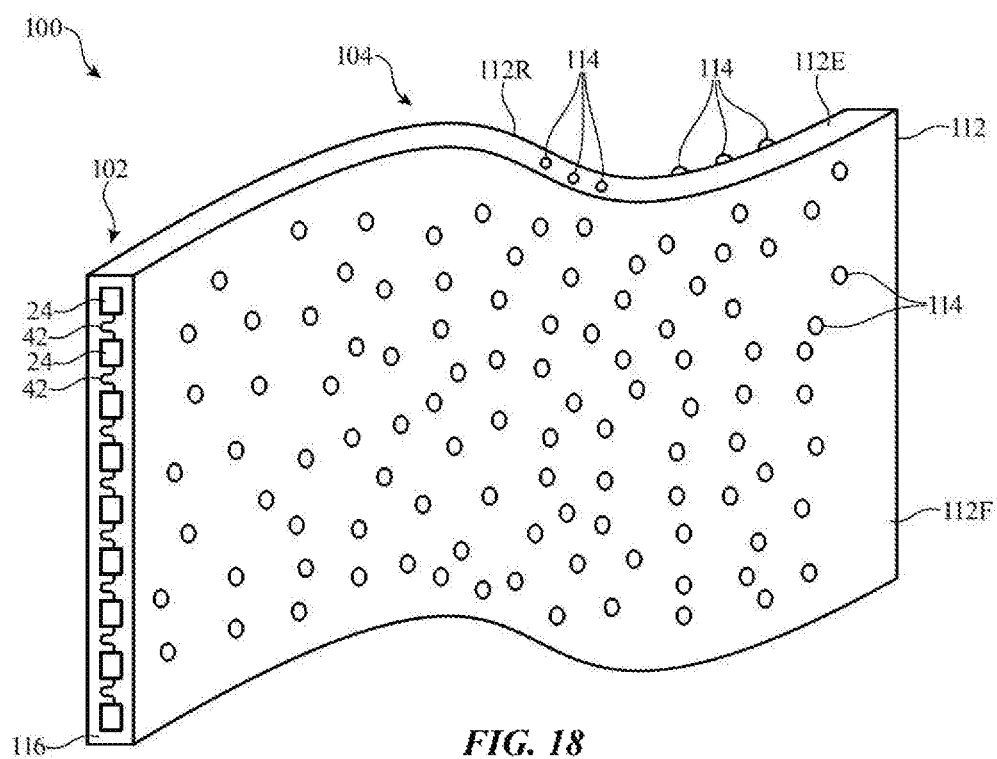
FIG. 18 is a perspective view of an illustrative stretchable lighting unit in accordance with an embodiment.

FIG. 18 is a perspective view of an illustrative stretchable lighting structure. As shown in FIG. 18, stretchable light unit (structure) 100 may include stretchable light source 102 and stretchable light guide 104. Stretchable light guide 104 may be formed from a stretchable transparent layer such as layer 112. Layer 112 may be formed from a sheet of transparent elastomer such as a stretchable clear plastic (e.g., silicone, etc.). Light may be emitted into the interior of layer 112 along the edge (edge surface) 116 of layer or may be otherwise launched into layer 112. In the example of FIG. 18, light source 102 has a plurality of light-emitting components 24 (e.g., components containing light-emitting diodes and/or other circuitry) on edge 116 that are electrically connected to control circuitry 16 and/or each other using paths 42 (e.g., stretchable serpentine signal paths or other stretchable signal paths). Light from components 24 in source 102 is launched into layer (light guide layer) 112 and is distributed throughout layer 112 by total internal reflection.

All or selected parts of layer 112 may be provided with light scattering structures such as light scattering features 114 of FIG. 18. Light scattering features 114 may be formed from protrusions, recesses, patterned coating material on the surfaces of layer 112, embedded microbeads, other light-scattering particles, or other embedded structures, and/or other structures that scatter light out of layer 112 (e.g., out of the plane of layer 112). As shown in FIG. 18, light scattering features 114 may include features 114 on the front surface of layer 112, features 114 that are embedded within layer 112, and/or features 114 that are formed on rear surface 112R of layer 112.

Figure 19:
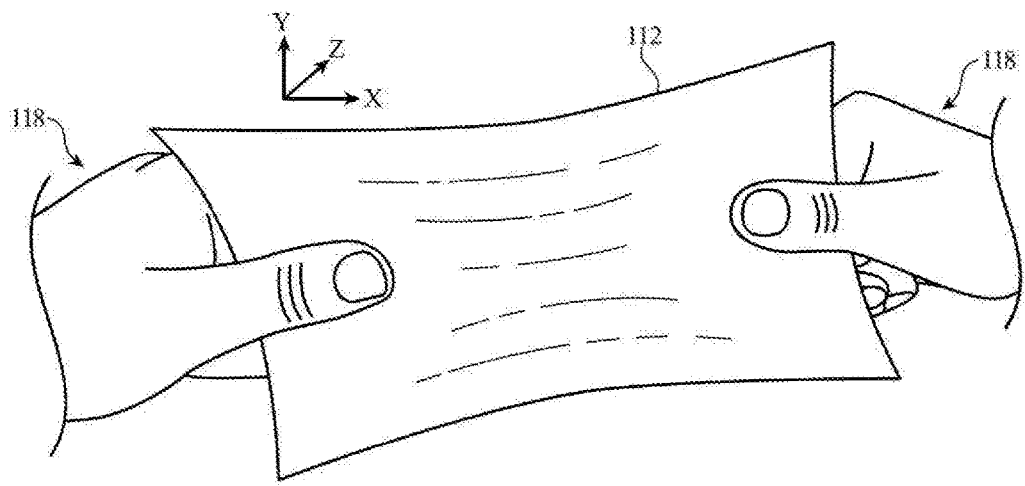
FIG. 19 is a perspective view of a stretchable lighting unit showing how a lighting unit may be stretched by a user in accordance with an embodiment.
Figure 20:
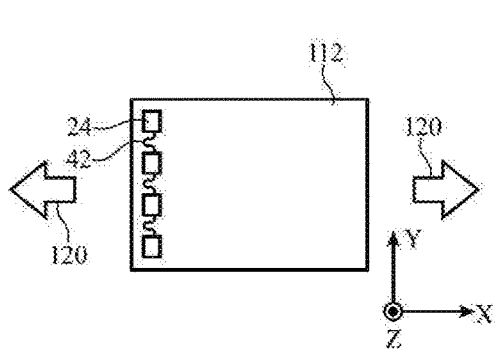
FIG. 20 is a top view of a stretchable lighting unit being stretched horizontally in accordance with an embodiment.
Figure 21:
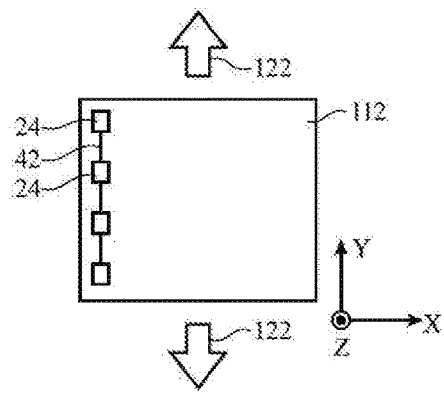
FIG. 21 is a top view of a stretchable lighting unit being stretched vertically in accordance with an embodiment.

Because stretchable light source 102 is formed using stretchable signal paths 42, stretchable light source 102 can stretch to accommodate stretching of layer 112. FIG. 19 shows how a user's hands and fingers 118 may be used to stretch layer 112. FIG. 20 shows how layer 112 may be stretched horizontally. FIG. 21 shows how layer 112 may be stretched vertically. Layer 112 may also be stretched diagonally and/or may be stretched to cover surfaces with compound curves (as examples). Layer 112 may be stretched during manufacturing and subsequently maintained in a fixed position within device 10 or layer 112 may be stretched dynamically by a user during operation of device 10.

Figure 22:
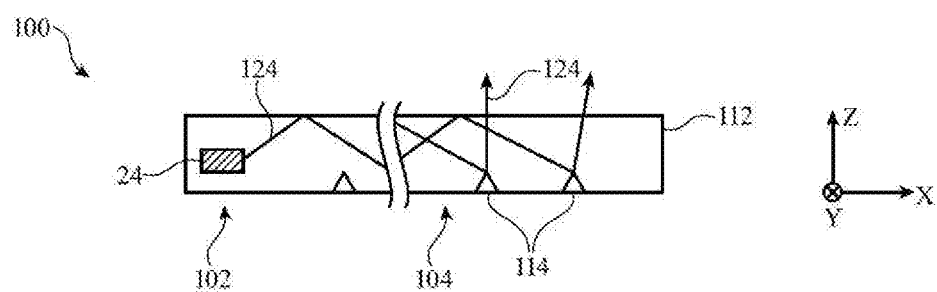
FIG. 22 is a cross-sectional side view of an illustrative stretchable lighting unit showing how light from a stretchable light source may be guided within a stretchable light guide layer by total internal reflection and can be scattered by light scattering structures in accordance with an embodiment.
Figure 23:
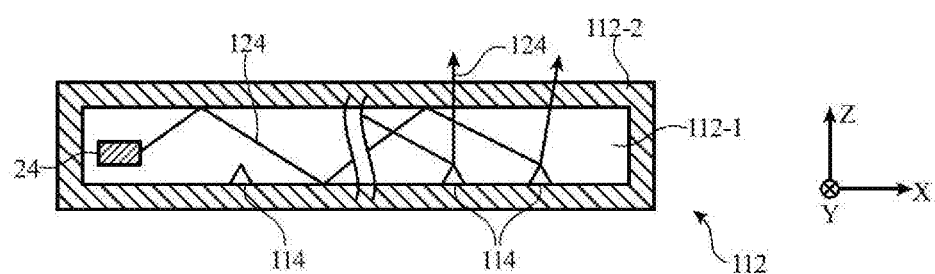
FIG. 23 is a cross-sectional side view of an illustrative stretchable lighting unit with a cladding layer in accordance with an embodiment.

FIG. 22 is a cross-sectional side view of an illustrative stretchable lighting unit. As shown in FIG. 22, lighting unit 100 may have stretchable light source 102 and stretchable light guide 104. Stretchable light source 102 may be formed from light-emitting diodes or other light-emitting components 24 that emit light 124 into stretchable layer 112 of light guide 104. Light 124 may propagate within layer 112 due to total internal reflection. Light scattering features 114 may be used to scatter light 124 out of layer 112 at desired areas of layer 112. FIG. 23 shows how a stretchable light guide layer 112 may have a core layer 112-1 and a cladding layer 112-2. Core layer 112-1 may have an index of refraction that is higher than that of the coating formed from layer 112-2 to promote total internal reflection. Layers 112-1 and 112-2 may be formed from clear elastomeric polymers (as an example).

Figure 24:
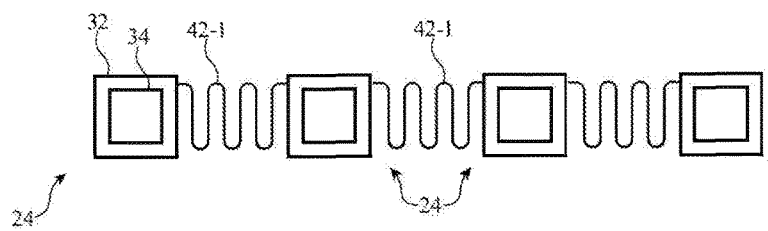
FIGS. 24, 25, and 26 are diagrams of illustrative stretchable light sources with light-emitting components joined by stretchable serpentine signal paths in accordance with embodiments.
Figure 25:
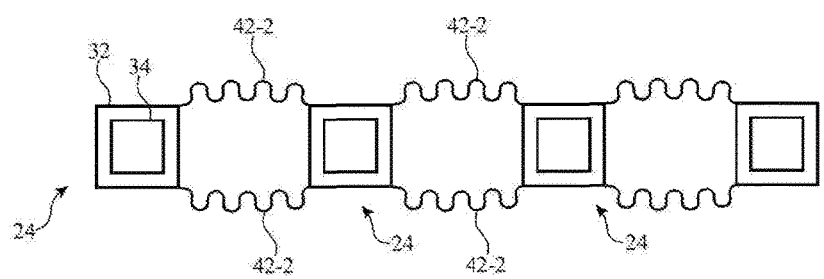
Figure 26:
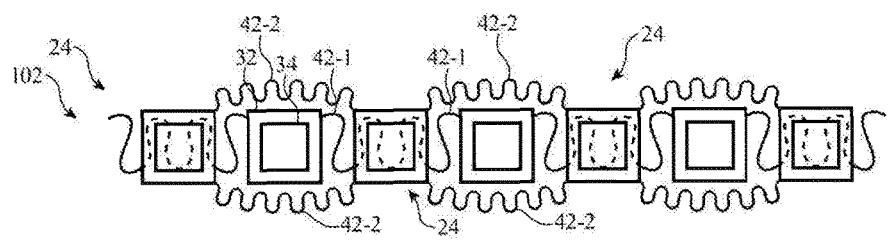
Figure 27:
FIG. 27 is a cross-sectional side view of the light source of FIG. 25 in accordance with an embodiment.
Figure 28:
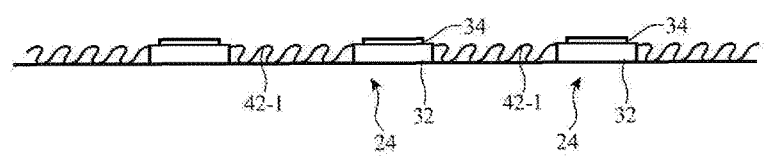
FIG. 28 is a cross-sectional side view of the light source of FIG. 24 in accordance with an embodiment.

FIGS. 24 and 25 show how components 24 may include light-emitting diodes or other light-emitting components 34 mounted on substrates such as interposers 32. Components 24 may be electrically coupled to each other and to control circuitry 16 by stretchable signal paths such as serpentine paths 42-1 (FIG. 24) and serpentine paths 42-2 (FIG. 25). The structures of FIGS. 24 and 25 may be stacked to form a two-layer stretchable light source such as light source 102 of FIG. 26. FIG. 27 is a side view of the upper layer of light source 102 of FIG. 26 (i.e., FIG. 27 is a side view of the structures of FIG. 25) and FIG. 28 is a side view of the lower layer of light source 102 of FIG. 26 (i.e., FIG. 28 is a side view of the structures of FIG. 24).

Figure 29:
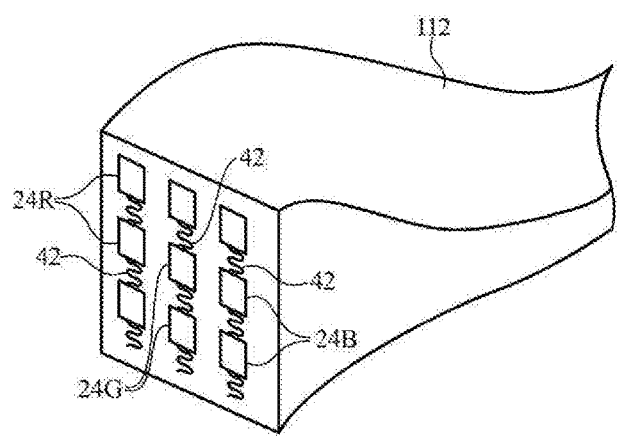
FIG. 29 is a perspective view of a portion of a stretchable light guide layer into which a stretchable light source is emitting light of multiple colors in accordance with an embodiment.

FIG. 29 is a perspective view of an edge portion of stretchable layer 112 showing how light-emitting components in light source 102 may emit light of different colors. Red light may be emitted by red light-emitting components 24R, green light may be emitted by green light-emitting components 24G, and blue light may be emitted by blue light-emitting components 24B. Components such as components 24R, 24G, and 24B may be coupled in any suitable order using serpentine paths 42. Other colors of light may be emitted by components 24, if desired.

Figure 30:
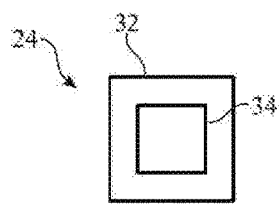
FIG. 30 is a top view of an illustrative light-emitting component having an interposer and a single light-emitting diode in accordance with an embodiment.
Figure 31:
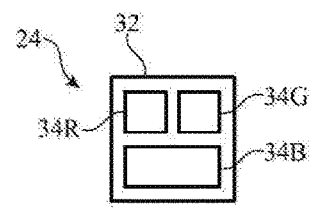
FIGS. 31 and 32 are top views of illustrative light-emitting components each having an interposer and multiple light-emitting diodes of different colors in accordance with embodiments.
Figure 32:
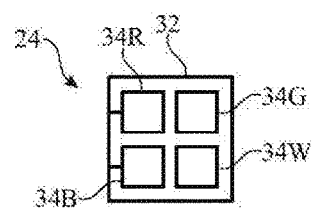

FIG. 30 is a top view of an illustrative light-emitting component 24 showing how a light-emitting diode or other light-emitting component 34 may be mounted on a substrate such as interposer 32. Component 34 of FIG. 30 may be a single-color light-emitting diode (as an example). In the arrangement of FIG. 31, red light-emitting diode 34R, green light-emitting diode 34G, and blue light-emitting diode 34B have been mounted on interposer 32. In the arrangement of FIG. 32, red light-emitting diode 34R, green light-emitting diode 34G, blue light-emitting diode 34B, and white light-emitting diode 34W have been mounted on interposer 32. Control circuitry may also be mounted on the interposers.

Figure 33:
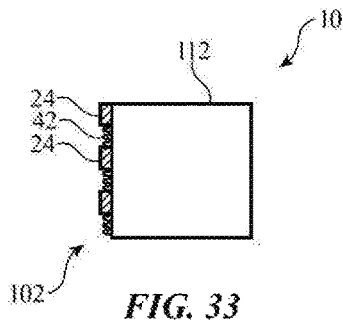
FIGS. 33, 34, 35, 36, 37, 38, and 39 are top views of illustrative stretchable light guides having light guide layers formed from elastomeric sheets of different shapes and having stretchable light sources mounted in different locations in accordance with embodiments.
Figure 34:
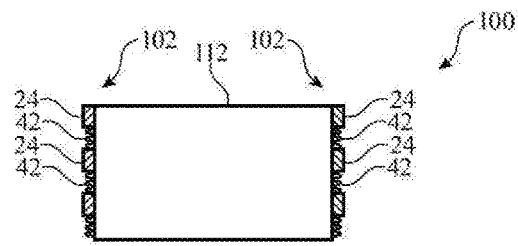
Figure 35:
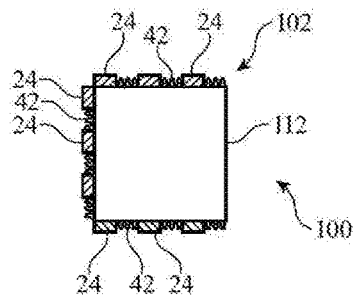
Figure 36:
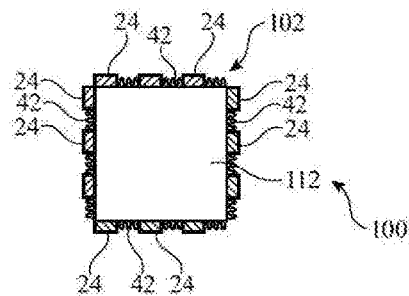
Figure 37:
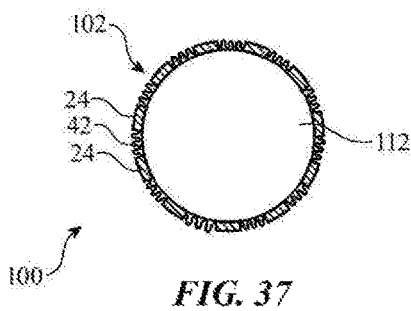
Figure 38:
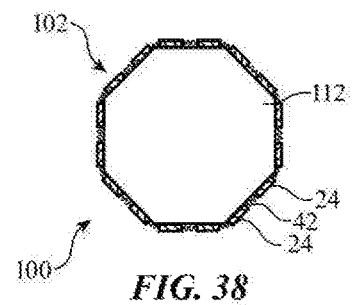
Figure 39:
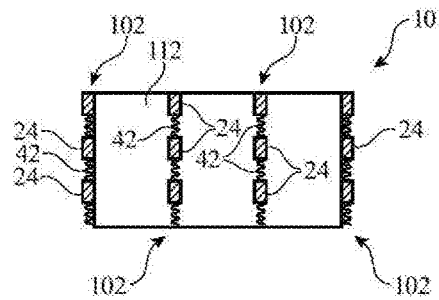

FIGS. 33, 34, 35, 36, 37, 38, and 39 are top views of illustrative stretchable light guide units 100 having various light guide and light source configurations. In the example of FIG. 33, layer 112 is rectangular and light source 102 is located along one of the edges of layer 112. In the example of FIG. 34, light source 102 includes arrays of components 24 along opposing edges of layer 112. Three edges of layer 112 have been provided with light-emitting components 24 in the example of FIG. 35 and four edges of layer 112 have been provided with light-emitting components 24 in the example of FIG. 36. FIG. 37 shows how layer 112 may be circular and how light source 102 may have light-emitting components 24 that run around the circumference of layer 112. FIG. 38 shows how layer 112 may be octagonal and how each of the eight sides of layer 112 may have light-emitting components 24. FIG. 39 shows how some of light-emitting components 24 of light source 102 may be embedded within layer 112 and some of light-emitting components 24 of light source 102 may be mounted on exposed external edge surfaces of layer 112. In general, layer 112 may have any suitable shape (i.e., a shape with one or more curved edges and/or one or more straight edges, etc.) and components 24 may be mounted one or within any suitable portions of layer 112. Layer 112 may or may not include light extraction features 114.

Figure 40:
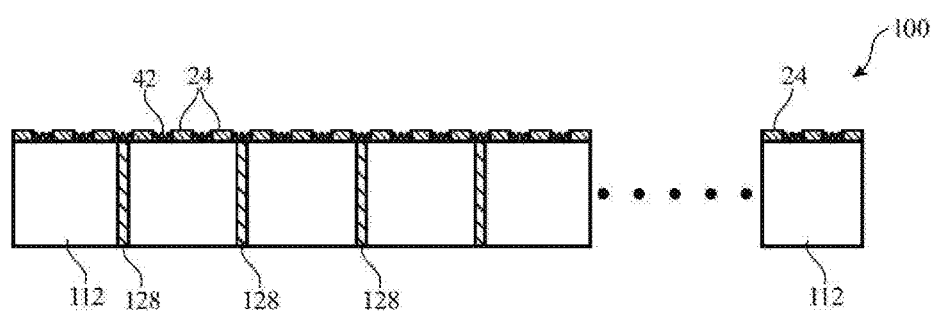
FIGS. 40, 41, and 42 are diagrams that show how stretchable light guides may be formed by stretching together multiple light guide layers with bonding material in accordance with embodiments.
Figure 41:
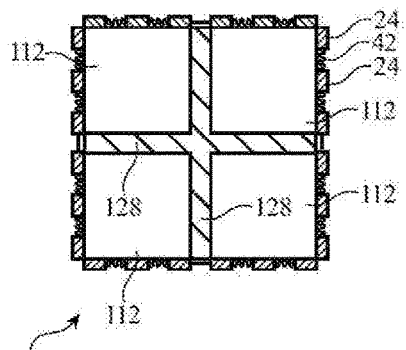
Figure 42:
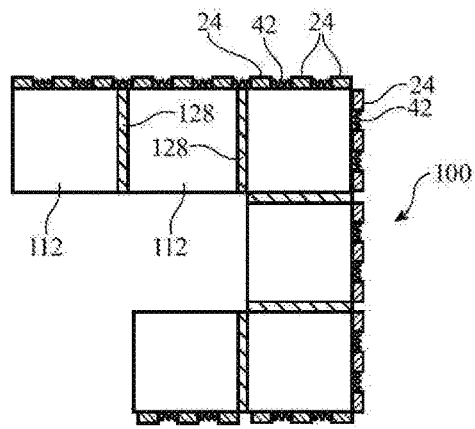

As shown in the illustrative configurations of FIGS. 40, 41, and 42, stretchable light source 100 may have a stretchable light guide layer 112 that is formed by stitching together multiple smaller areas of light guide material (e.g., rectangular sheets or sheets of other shapes) using bonding material 128 (e.g., clear elastomeric adhesive such as silicone adhesive or other suitable bonding layer). Bonding material 128 may have an index of refraction that matches that of layer 112 (e.g., that is within +/−0.1 of that of layer 112) to suppress reflections. Panels of layer 112 may be stitched together linearly (FIG. 40), in a rectangular tiled configuration (FIG. 41), or in other suitable shapes (see, e.g., the illustrative layout of FIG. 42).

Figure 43:
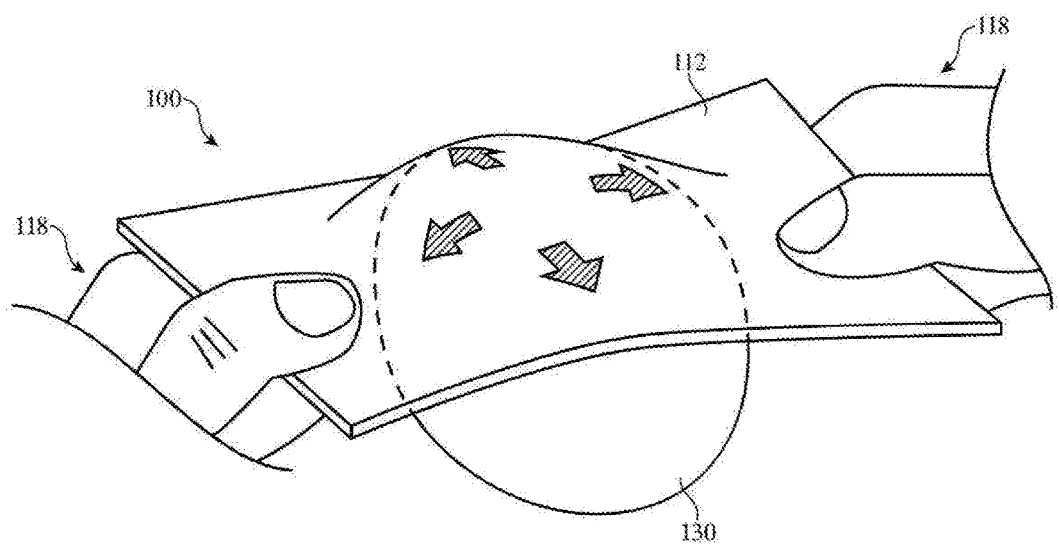
FIG. 43 is a perspective view of an illustrative stretchable light guide that is conforming to a curved surface of an object in accordance with an embodiment.

As shown by illustrative stretchable light guide unit 100 of FIG. 43, layer 112 may be stretched to conform to a curved surface such as the surface of spherical object 130 or other surface with compound curves (e.g., layer 112 may be stretched in directions 132 by hands 118). Adhesive or other attachment structures may be used to attach unit 100 to structure 130 (i.e., structure 130 may serve as a support structure in device 10) or unit 100 may be stretched dynamically during use of device 10.

Figure 44:
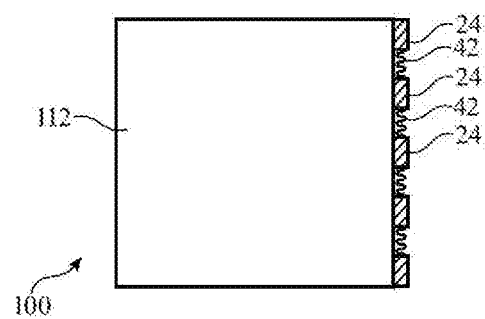
FIG. 44 is a top view of an illustrative stretchable lighting unit having a light source mounted on an exterior edge surface of a stretchable light guide layer in accordance with an embodiment.
Figure 45:
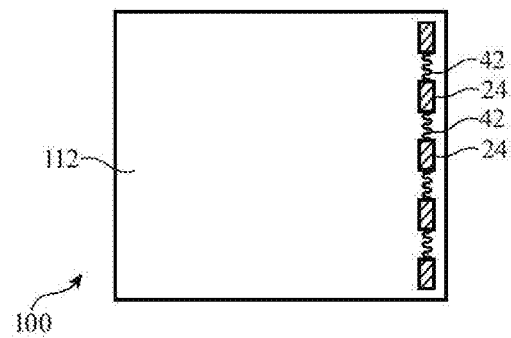
FIG. 45 is a top view of an illustrative stretchable lighting unit having a light source embedded within a stretchable light guide layer in accordance with an embodiment.

FIG. 44 shows how components 24 and stretchable signal paths 42 may be mounted on an edge surface of layer 112. As shown in FIG. 45, some or all of components 24 may be embedded within layer 112.

Figure 46:
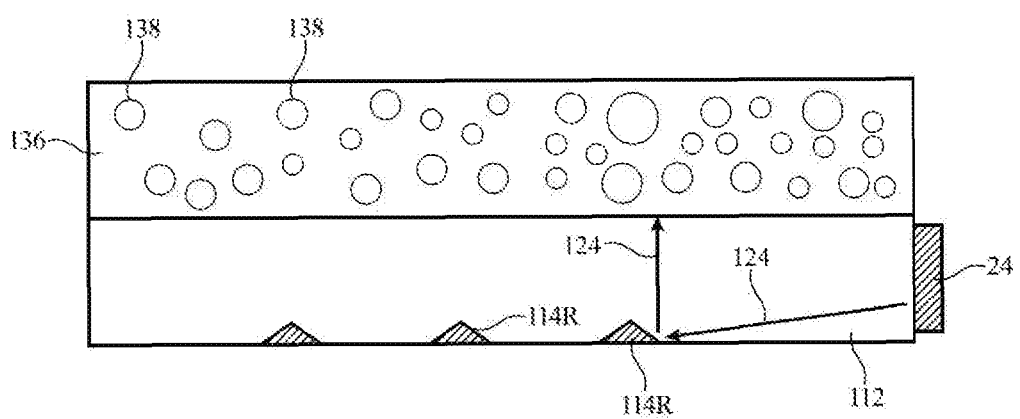
FIG. 46 is a cross-sectional side view of an illustrative stretchable lighting unit having a light downconversion layer in accordance with an embodiment.

If desired, light 124 may be downconverted in frequency (e.g., converted from a shorter wavelength to a longer wavelength). For example, light 124 may be downconverted by forming a downconversion layer by incorporating downconverting agent into elastomeric material in stretchable light guide unit 100. As shown in FIG. 46, downconverting agent 138 may be incorporated into an encapsulating layer such as layer 136 on layer 112 to form a downconversion layer. Downconversion material for unit 100 such as agent 138 may include phosphors, quantum dots, or other agents for downconverting light 124. For example, agent 138 may include red and green quantum dots so that blue light 124 from light-emitting component 24 may be converted to red, green, and glue light when emitted by unit 100 or may include phosphors that convert blue light into white light (as examples). If desired, downconverting agent 138 may be incorporated into layer 112, may be incorporated into light-emitting diode structures in components 24, and/or may be incorporated into other coatings, layers of material in unit 100, or other structures in device 10. The illustrative configuration of FIG. 46 in which layer 136 (e.g., a clear elastomeric polymer or other encapsulation layer) has been provided with downconverting material such as agent 138 is merely illustrative.

Figure 47:
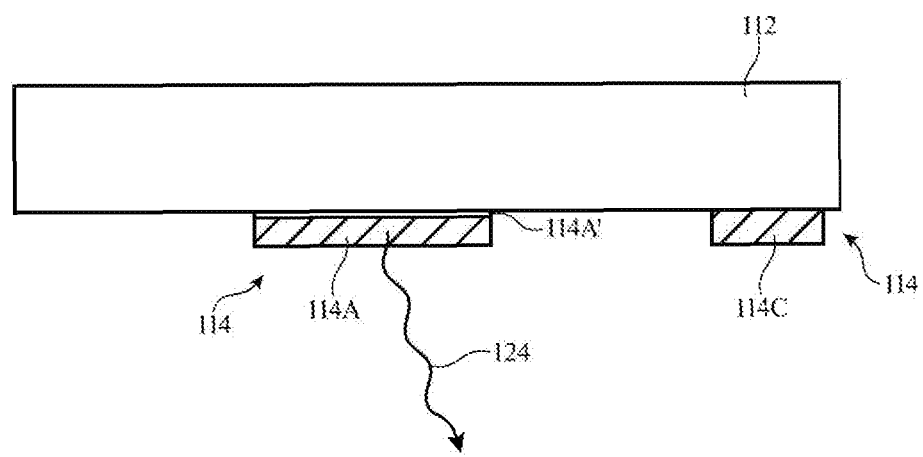
FIG. 47 is a cross-sectional side view of an illustrative stretchable lighting unit having light extraction structures such as a patterned coating or layer of material attached to a surface of a light guide layer with adhesive in accordance with an embodiment.

FIG. 47 is a side view of unit 100 in an illustrative configuration in which light scattering features 114 include surface-mounted structures. The surface mounted structures on layer 112 may be formed by printing or otherwise patterning a coating layer on layer 112 (see, e.g., patterned light-scattering coating 114C), may be formed by attaching light-scattering structures such as structure 114A to layer 112 using adhesive 114A', or may be formed by attaching other light-scattering structures to layer 112. Light-extraction structures may be permanently attached to light guide layer 112, may be temporary attached using a pressure sensitive adhesive or other temporary bonding agent, or may be attached using other mounting techniques. Light-extraction structures such as features 114 of FIG. 47 may include optical structures that form lenses, diffusive light-scattering structures (e.g., hazy material or textured material), or colored material for coloring light 24. Structures 114 of the type shown in FIG. 47 or other light extraction features may be patterned to form characters, logos, icons, other symbols, or other patterns. This type of light-scattering feature may be selectively applied to areas of layer 112 for functional purposes (e.g., to scatter backlight for a display where desired), for decorative purposes (e.g., to form a decorative trim), or to form a symbol or other label that informs a user of the location of an input-output device such as the location of a button, force sensor, touch sensor, etc.

Figure 48:
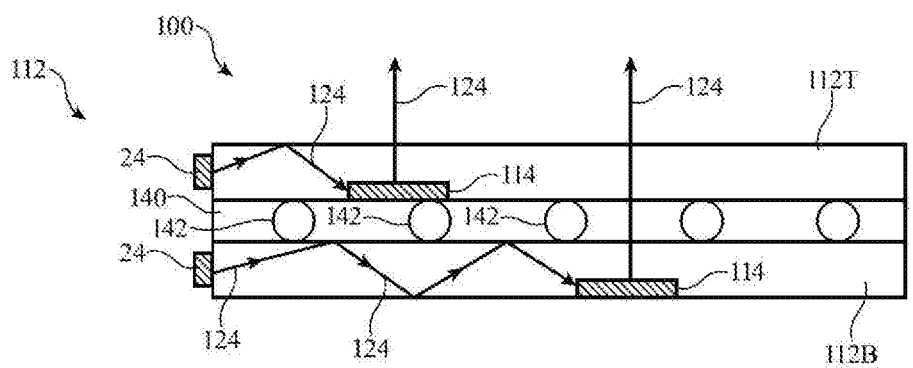
FIGS. 48 and 49 are cross-sectional side views of stretchable lighting units having multiple stretchable light guide layers in accordance with embodiments.
Figure 49:
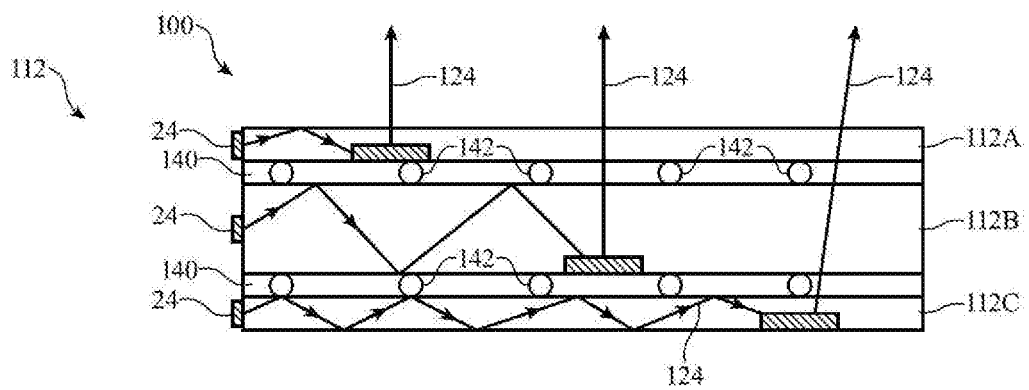

FIGS. 48 and 49 show how multiple stretchable light guide layers may be used in forming stretchable lighting unit 100. As shown in the example of FIG. 48, separation layer 140 may be interposed between upper light guide layer 112T and lower light guide layer 112B. Layer 140 may have an index of refraction that is lower than that of layers 112T and 112B so that layer 140 serves as an optical cladding layer. Optional spacers 142 (e.g., microspheres, columns of polymer, or other spacer structures) may be incorporated into layer 140 to ensure that the gap between layers 112T and 112B is even. Layers 112T and 112B may each have a respective array of light-emitting components 24 and stretchable paths 42. The light-emitting components may emit light 124 into each of layers 112T and 112B that is scattered out of unit 100 by light scattering structures 114. In the example of FIG. 49 two of cladding layers 140 are used in separating light guide layers 112A, 112B, and 112C.

Layers 140 of FIGS. 48 and 49 may be formed from a deformable material such as a liquid, a gel (e.g., a deformable sol-gel material), a gaseous material with spacer structures (e.g., air, nitrogen, gas mixtures, etc.), a porous membrane that forms spacer structures and that is filled with gaseous material, or other suitable material that can be compressed by external pressure (as an example). Spacers 142 may have an index of refraction that is matched to that of layers 140 (e.g., spacers 142 may have an index that deviates by less than +/−0.1 or other suitable amount from the index of layers 140). If desired, layers 140 may be formed from clear elastomeric polymer.

Figure 50:
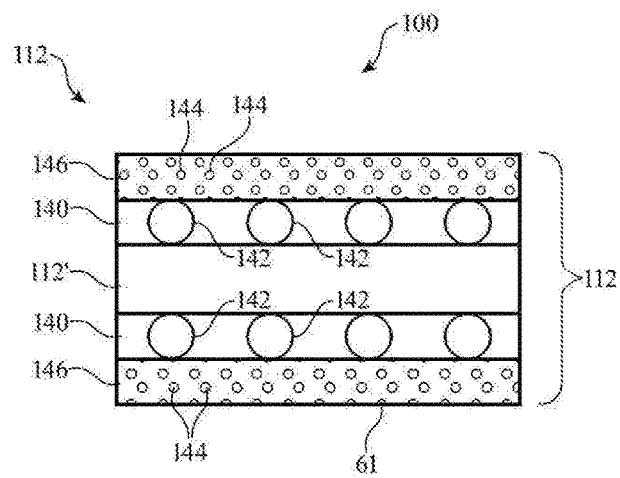
FIGS. 50, 51, and 52 are cross-sectional side views of stretchable light guide structures with deformable surfaces that allow the structures to serve as sensors that detect pressure from a finger in accordance with embodiments.

FIG. 50 is a cross-sectional side view of unit 100 in an illustrative configuration that includes light-scattering material such as light-scattering agent 144. Light-scattering agent 144 may include light-scattering particles, light-scattering microspheres, microvoids (e.g., bubbles of air or other gas), or other features that enhance light scattering. Agent 144 may be embedded within a stretchable clear polymer layer (e.g., a silicone layer or other elastomeric polymer layer) such as encapsulation layer 146. Separation layers such as layers 140 with optional spacers 142 may be use to separate stretchable encapsulation layers 146 from light guide layer 112' of light guide layer 112.

Structures such as structure 100 of FIG. 50 may deform when pressure is applied by a finger (finger 118) of a user or by other external objects. Emitted light created when structure 100 is deformed may provide a user with visual feedback or may be detected (e.g., when structure 100 is used as part of a light-based structure in a pressure sensor, force sensor, touch sensor, button, or other sensor responsive to applied force).

Figure 51:
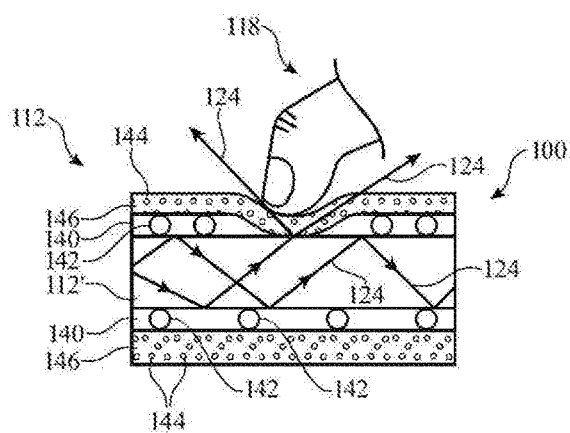

The deformation of structure 100 when pressure is applied by finger 118 is illustrated in FIG. 51. Layer(s) 140 may have a lower index than layer 112'. Layer 146 may have an index that matches that of layer 112' to encourage light leakage when layer 146 contacts layer 112' or may have other suitable index values.

Figure 52:
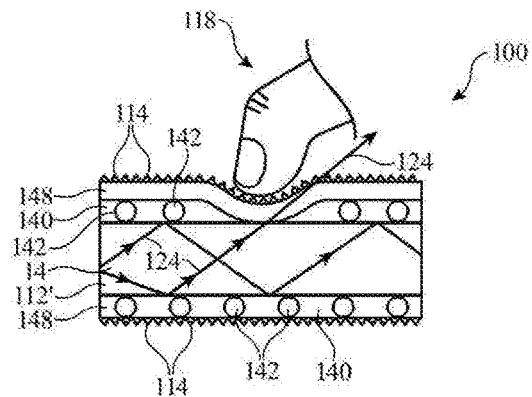

As shown in FIG. 51, the layers that make up structure 100 such as layer 146 may and 140 may be deformed by pressure from finger 118, thereby locally defeating total internal reflection of light 124 and locally allowing light 124 to escape from layer 112' of layer 112 and unit 100. The light that is extracted from layer 112 in this way may create a glowing effect around the point of contact between finger 118 and layer 112 due to light scattering in layer 148 by light-scattering structures 144 or may otherwise be visible to a user of device 10. If desired, light extraction features 114 may be incorporated into this type of stretchable lighting unit (see, e.g., FIG. 52).

The foregoing is merely illustrative and various modifications can be made by those skilled in the art without departing from the scope and spirit of the described embodiments. The foregoing embodiments may be implemented individually or in any combination.

What is claimed is:

1. Apparatus, comprising:
a stretchable light guide; and
a stretchable light source that emits light into the stretchable light guide, wherein the stretchable light source includes a plurality of light-emitting diodes, wherein the stretchable light source includes serpentine signal paths coupled between the light emitting diodes, and wherein the plurality of light-emitting diodes are embedded within the stretchable light guide.

2. The apparatus defined in claim 1 wherein the stretchable light guide includes an edge surface and wherein the stretchable light source is mounted on the edge surface and emits the light into the stretchable light guide through the edge surface.

3. The apparatus defined in claim 1 wherein the stretchable light guide includes light scattering structures and wherein the light scattering structures comprises structures selected from the group consisting of: protrusions and recesses.

4. The apparatus defined in claim 1 wherein the stretchable light guide includes light scattering structures and wherein the light scattering structures comprises a structures attached to a surface of the stretchable light guide.

5. The apparatus defined in claim 1 wherein the stretchable light guide comprises a polymer sheet having a first index of refraction and a polymer coating on the polymer sheet that has a second index of refraction that is less than the first index of refraction.

6. The apparatus defined in claim 1 wherein the light source comprises multiple layers of the light-emitting diodes stacked on top of each other.

7. The apparatus defined in claim 1 further comprising interposers on which the light-emitting diodes are mounted, wherein the light-emitting diodes include light-emitting diodes of different colors.

8. The apparatus defined in claim 1 wherein the stretchable light guide includes a plurality of sheets of material with edges that are joined using transparent bonding material.

9. The apparatus defined in claim 1 wherein the stretchable light guide includes a transparent elastomeric sheet and includes an elastomeric coating on the elastomeric sheet and wherein the light has a first wavelength, the apparatus further comprising downconversion material in the elastomeric coating that converts the light of the first wavelength into light with a second wavelength that is longer than the first wavelength.

10. The apparatus defined in claim 1 wherein the stretchable light guide includes first and second transparent elastomeric layers that guide the light, and wherein the stretchable light source includes a first set of the light-emitting diodes that emit a first portion of the light into the first transparent elastomeric layer and a second set of the light-emitting diodes that emit a second portion of the light into the second transparent elastomeric layer and wherein the apparatus further comprises:
a separation layer between the first and second transparent elastomeric layers, wherein the separation layer comprises a layer selected from the group consisting of: a liquid layer and a gel layer; and
spacers in the separation layer that define a gap between the first and second transparent elastomeric layers.

11. The apparatus defined in claim 1 wherein the stretchable light guide includes an elastomeric sheet and a light scattering coating on the elastomeric sheet.

12. A stretchable device, comprising:
a light-emitting component;
a stretchable light guide layer that receives light from the light-emitting component;
an elastomeric layer;
a separation layer between the stretchable light guide layer and the elastomeric layer; and
spacers in the separation layer that define a gap between the elastomeric layer and the stretchable light guide layer.

13. The stretchable device defined in claim 12 wherein the separation layer comprises a layer selected from the group consisting of: a liquid layer, a gel layer, and a layer having gaseous material and spacer structures.

14. The stretchable device defined in claim 12 further comprising light scattering structures on the stretchable light guide, wherein the light-emitting component comprises a light-emitting component selected from the group consisting of: a light-emitting diode and a laser diode.

15. A stretchable lighting unit, comprising:
a stretchable light guide formed from a sheet of elastomeric polymer having light scattering structures, wherein the light scattering structures comprise structures selected from the group consisting of: protruding portions of the sheet of elastomeric polymer and recessed portions in the sheet of elastomeric polymer; and
a stretchable light source having light-emitting diodes and stretchable signal paths coupled between the light-emitting diodes, wherein the light-emitting diodes emit light into the sheet of elastomeric polymer and wherein the light is scattered out of the sheet of elastomeric polymer by the light scattering structures.

* * * * *